United States Patent [19]
Silfvast

[11] Patent Number: 5,677,959
[45] Date of Patent: Oct. 14, 1997

[54] AUDIO SIGNAL SOURCE BALANCING ADAPTERS

[76] Inventor: Robert D. Silfvast, 309 Cowper St., Palo Alto, Calif. 94301

[21] Appl. No.: 375,389

[22] Filed: Jan. 18, 1995

[51] Int. Cl.$^6$ .................. H04B 3/00; H03H 7/38
[52] U.S. Cl. .................. 381/77; 333/25; 333/32
[58] Field of Search .................. 381/77, 94, 120, 381/118; 333/25, 32; 174/32, 34

[56] References Cited

U.S. PATENT DOCUMENTS

| | | | |
|---|---|---|---|
| 3,327,253 | 6/1967 | Campbell | 333/32 |
| 3,956,709 | 5/1976 | Osakabe et al. | 330/124 R |
| 5,157,338 | 10/1992 | Motherbaugh et al. | 324/637 |
| 5,222,149 | 6/1993 | Palmer | 381/77 |
| 5,307,416 | 4/1994 | Martin | 381/77 |
| 5,484,298 | 1/1996 | Flum et al. | 439/188 |
| 5,495,212 | 2/1996 | DeCramer | 335/25 |
| 5,517,572 | 5/1996 | Heyl | 381/94 |
| 5,585,767 | 12/1996 | Wright, Jr. | 333/32 |

OTHER PUBLICATIONS

Interference Handbook, William R. Nelson, 1981, pp. 128–130.

*Primary Examiner*—Curtis Kuntz
*Assistant Examiner*—Xu Mei
*Attorney, Agent, or Firm*—Donald R. Boys

[57] ABSTRACT

An audio signal source balancing adapter provides connection between an unbalanced audio source and a balanced input amplifier of an audio processing instrument, such as an audio mixer panel, with a variable resistor in the cold line, so the input impedance may be matched by adjusting the variable resistor until "hum" disappears at the audio processing instrument. In one embodiment the balancing adapter has a mono plug at one end of a shielded cable and a stereo plug at the other, with a variable resistor, such as a rotary potentiometer, mounted in a housing at the mono plug. In another embodiment, a single housing has a mono plug in one wall of the housing and an XLR connector in another, with a rotary potentiometer within the housing, and wired to provide a balancing impedance in the cold line between the connectors. In yet another embodiment, an adapter box is provided wherein several inputs may be plugged into receptacles at the box using standard mono plug cables, and each of the inputs may be output via associated XLR connectors and XLR cables going to balanced inputs of an audio instrument.

11 Claims, 6 Drawing Sheets

For both Figs 3A and 3B $$C = \frac{R_{IN}}{R_S + R_{IN}} < 1$$

5,677,959

1

AUDIO SIGNAL SOURCE BALANCING ADAPTERS

FIELD OF THE INVENTION

The present invention is in the area of audio processing equipment, and relates more particularly to apparatus and methods for eliminating hum produced by ground noise in audio signal processing.

BACKGROUND OF THE INVENTION

In almost all audio circuitry, and in circuitry for many other purposes, such as control circuitry, a common voltage reference is sought, referred to most often as the "ground" reference. This reference is conveniently thought of as "zero" volts. Many schemes have been developed for connecting the ground side of circuitry for interfaced and interacting electrical and electronic equipment to provide this reference.

Zero volts, however, is a convenient fiction, because voltage level is a relative term. Also, even though all portions of a grounding circuit may be interconnected by electrical conductors, with no high resistance or high impedance elements between connection points, if there is current flow in any portion of interconnected ground wiring in a circuit, there will be differences in voltage level at various points in the ground wiring. This characteristic of ground potential varying at different points in a system is quite common, and virtually unavoidable for large and/or complicated systems, because all of the wiring has at least some resistance, and physical separation requires wire length equivalent in dimension to the distance of separation. Also, currents may be induced in ground wiring in a number of other ways, such as induction from magnetic fields created by power sources.

The problems of voltage variance at different points in a ground circuit is often referred to in the art as "ground loop" problems. In control equipment, ground loop problems can cause inadvertent switching of control circuitry, especially electronic control circuitry where voltage levels are relatively low, and errors in measurement. In audio processing equipment, which is the primary concern of the present invention and of the inventor, ground loop problems manifest themselves as output hum, typically at the frequency of the mains power, which frequency in the U.S.A. is typically kept at or near 60 cycles per second.

In an effort to minimize noise problems due to variation in ground potential, manufacturers of audio equipment for receiving and processing audio signals, such as mixer panels (consoles), have instituted balanced differential amplifiers for receiving the audio signals. These amplifiers extract the difference between the voltages appearing on the two input terminals, and the two terminals typically have equal input impedances.

FIG. 1 is a simplified schematic of a prior art balanced differential amplifier having input terminals A (which is termed the "hot" terminal) and B (which is termed the "cold" terminal). The voltages, relative to the amplifier's ground reference, on input terminals A and B are labeled as $V_A$, and $V_B$ respectively, in FIG. 1. The amplifier's output voltage $V_{OUT}$ is represented by the difference $V_A - V_B$.

Theoretically, any common-mode signal that appears on both the hot and the cold terminals of a balanced differential amplifier like that shown in FIG. 1 will be canceled out by the difference taken by the input amp at the console. For use with such a balanced input amplifier, sources, such as tape machines, keyboards and other instruments with electrical pickups, microphones, effects units, and so forth, can have individual grounds, if they have matched output impedances (balanced sources). Since such a balanced source derives its output voltage based on its own ground, the hot and cold output terminals from the source will each have the same magnitude of hum-producing voltage, which will be canceled out by the balanced input differential amplifier at the console.

FIG. 2 illustrates the case of a typical balanced source 11 connected to a balanced input amplifier 15. The source voltage $V_S$ is usually delivered by placing $(+V_S/2)$ on the "hot" output terminal (line 17) and $(-V_S/2)$ on the "cold" output terminal (line 19). The net voltage, then, across the hot and cold output terminals (into an open circuit) is $V_S$. $V_N$ represents any voltage difference between the ground reference points of the source and the receiver. $V_N$ is often a result of current flowing in shield conductor 13, but could be produced by other phenomena, as described above. In some cases, if shield conductor 13 is disconnected at one end, which is a typical practice in audio systems, in attempting to minimize ground loops), $V_N$ is due to the fact that the source and the receiver are separately grounded by power outlets that are physically separated by a substantial distance.

The important factor for reducing hum-inducing voltage in a balanced system, such as that shown in FIG. 2, is not necessarily the splitting of the source voltage between the hot and cold outputs of the source; rather it is to balance (i.e. set equal) the source impedances on the two output terminals. These source impedances are shown as resistors of value $R_S$ in FIG. 2. The reason for matching source impedances is to maximize common mode rejection when connecting the source to a differential receiving amplifier which has matched input impedances.

When the output impedances of the source are matched and the input impedances of the receiver are matched, then the voltage divider ratio is the same on the hot and cold lines of the interconnecting cable. This causes the signals on the hot and cold terminals to be attenuated by the same factor. This factor is shown as the constant C in FIG. 2, where $C = R_{IN}/(R_S + R_{IN})$. Ensuring equal attenuation on both lines allows the input amplifier to fully reject any common-mode component in the signal ($V_N$ in FIG. 2). When the attenuation factor is not the same on the hot and cold lines, then a portion of the common-mode signal becomes a differential signal which the input amplifier cannot cancel.

It is known in the art that balanced sources are much preferred as inputs to audio processing equipment having balanced input amplifiers, such as audio mixer consoles. Balanced sources are not, however, always available. In a studio environment, depending on many variable circumstances, unbalanced musical instruments and other unbalanced input equipment will often be encountered and must be accommodated, and, in most cases, the source impedance is not known.

FIG. 3A illustrates the problem case of an unbalanced source 21 connected to a balanced input amplifier 23. In this case, the signal on hot line 25 may be represented by $C(V_S + V_N)$. The signal on cold line 27 is $V_N$, the difference after the balanced input amp is easily shown to be, by familiar algebraic manipulation, $C(V_S) + (C-1)V_N$. It is seen, then, for the case of an unbalanced source and a balanced input amplifier, that any voltage resulting from current (or some other source) in ground connection 29 becomes a component of the signal after the balanced input amp, hence hum.

3

What is clearly needed is apparatus applicable to unbalanced sources when connecting such sources to audio processing equipment, such as an audio mixer console, to conveniently balance the source impedance so balanced input amplifiers will cancel any signal induced in ground connections.

SUMMARY OF THE INVENTION

In a preferred embodiment of the present invention an impedance-balancing adapter is provided for connecting an unbalanced source to a balanced input of an audio instrument. The adapter comprises a first connector having a first terminal and a second terminal, compatible with an output connector of an unbalanced audio source; and a second connector having a third terminal, a fourth terminal, and a fifth terminal, compatible with a three-conductor input to a balanced input amplifier at an audio processing instrument, such as an audio mixer panel. The first terminal at the first connector is connected by a first electrical conductor to the third terminal at the second connector, the second terminal of the first connector is connected by a second electrical conductor to the fourth terminal at the second connector, and the second terminal at the first connector is connected by a third electrical conductor to the fifth terminal at the second connector through a variable resistor.

The adapter provides a convenient apparatus to connect unbalanced sources to balanced inputs of audio instruments while balancing the input impedance of the unbalanced sources. The adapters take several different forms in differing embodiments of the invention. In one embodiment a shielded cable connects a two-conductor, mono audio plug to a three-conductor stereo audio plug, the ground terminal at the mono plug connected to the cold terminal at the stereo audio plug through a variable resistor mounted near the mono plug. This cable provides a direct connection with an adjustable resistance for balancing out input hum. RCA™-type phone jacks may be used in place of the mono plug.

In another embodiment an adapter plugs into an output receptacle of an unbalanced source, and provides an XLR connector for connecting to a three-wire cable to an audio instrument. In yet another embodiment plural sets of receptacle connectors are provided in an adapter box, such that unbalanced sources may be connected to the box via standard plug cables, and XLR male connectors are provided in the same box, wired to the receptacle connectors through variable resistors, allowing a user to connect plural unbalanced sources to multiple inputs of one or more audio instruments.

The adapters of the invention provide a convenient, inexpensive, and effective way to balance unbalanced sources as they are connected to an audio instrument.

4

Figure 5:
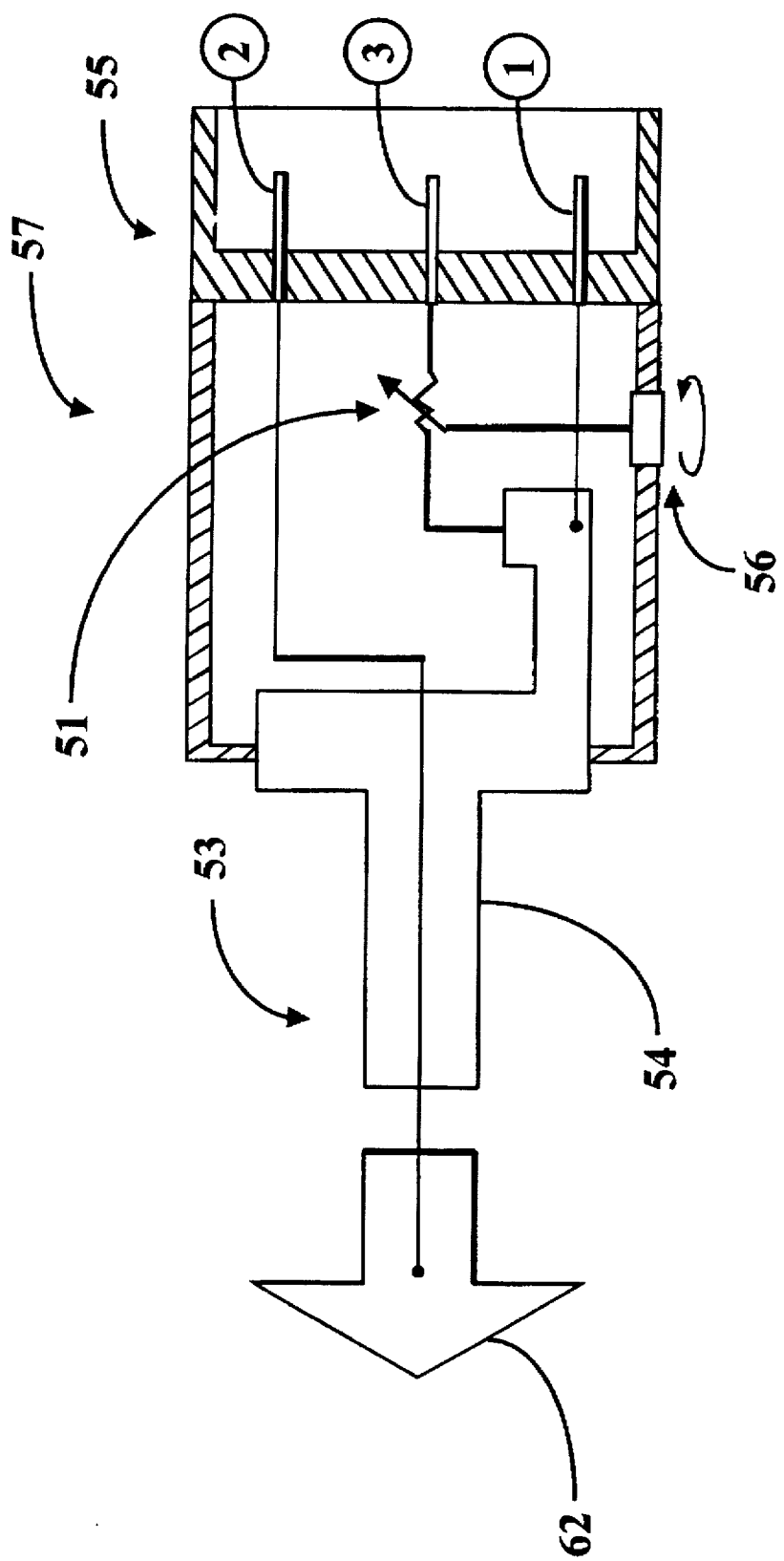

FIG. 5 is a mostly schematic cutaway illustration of a transition connector, providing a transition from a two-conductor plug to a three-pin XLR connector in an embodiment of the present invention.

Figure 6A:
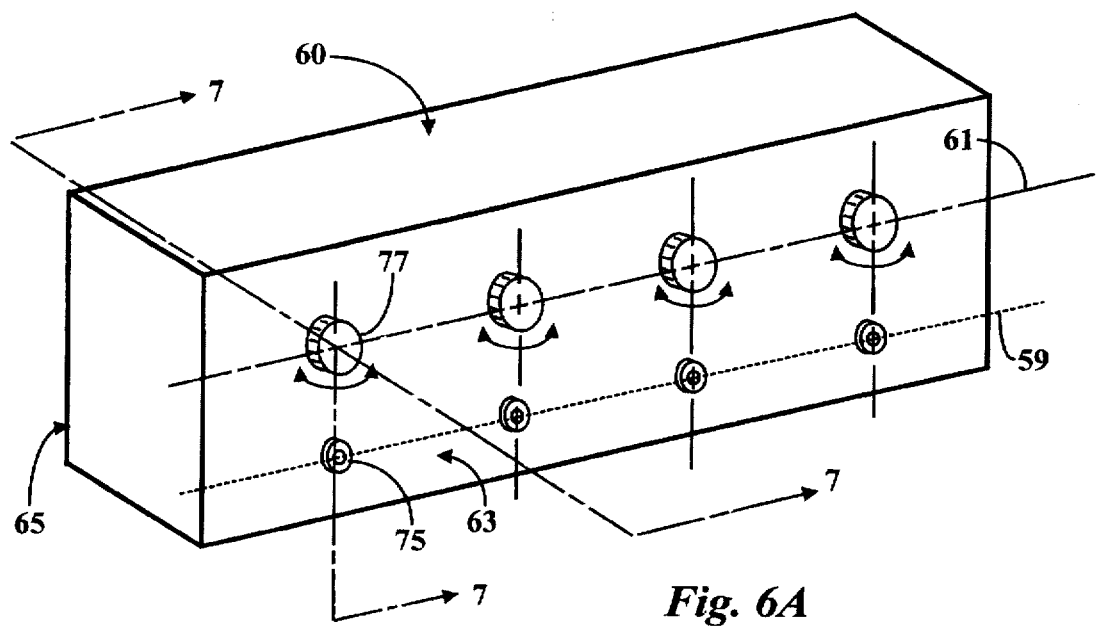

FIG. 6A is an isometric view of an audio signal source balancing patch box according to an embodiment of the present invention.

Figure 6B:
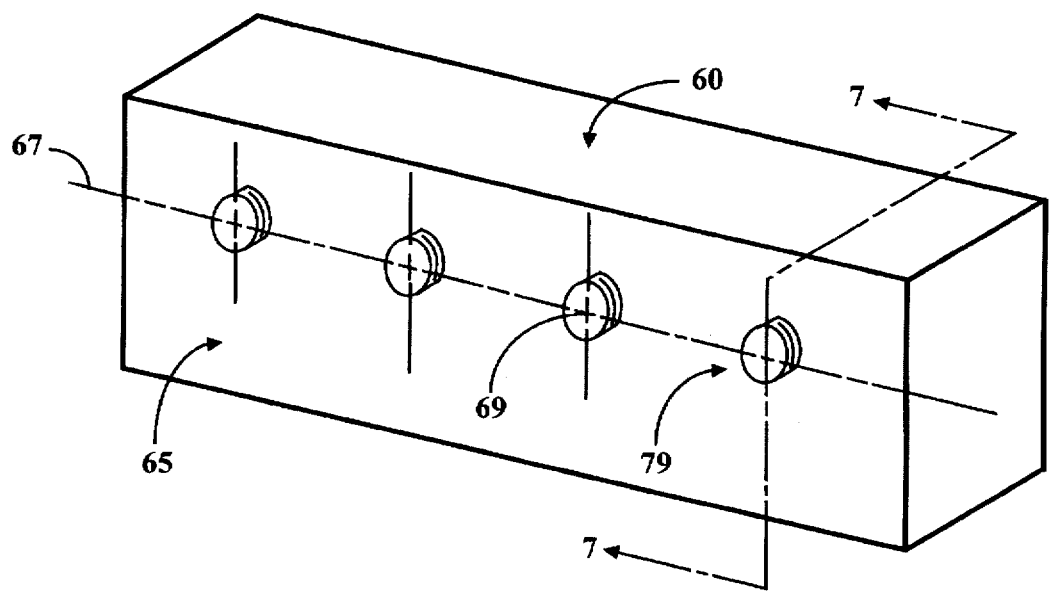

FIG. 6B is an isometric view of the audio signal source balancing patch box of FIG. 6A from another perspective, to show the rear of the box not seen in FIG. 6A.

Figure 7:
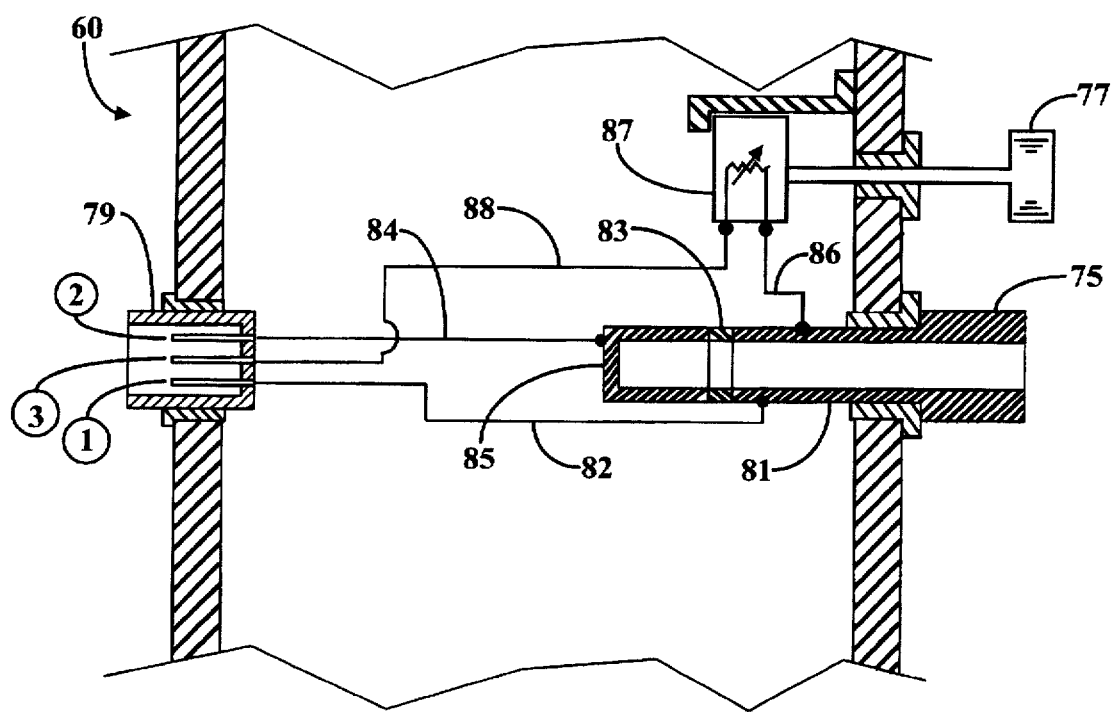

FIG. 7 is a partial section view through the balancing patch box of FIGS. 6A and 6B along section line 7—7 of FIGS. 6A and 6B.

DESCRIPTION OF THE PREFERRED EMBODIMENTS

Figure 1:
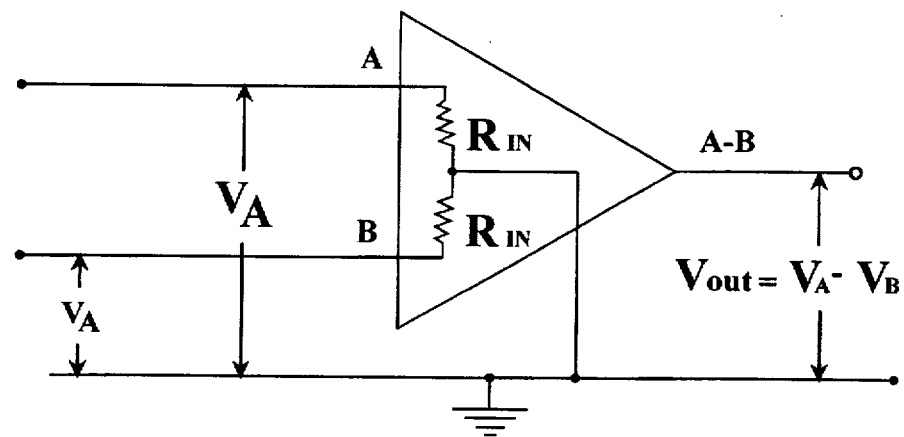
FIG. 1 is a simplified schematic of a prior art balanced differential amplifier.
Figure 2:
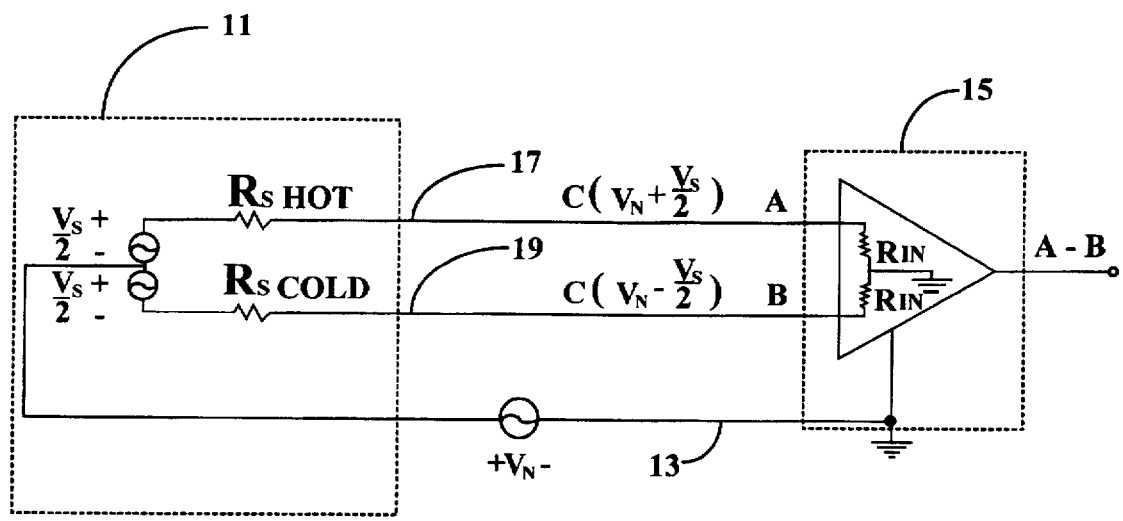
FIG. 2 is a schematic illustrating the case of a typical balanced source connected to a balanced input amplifier.
Figure 3A:
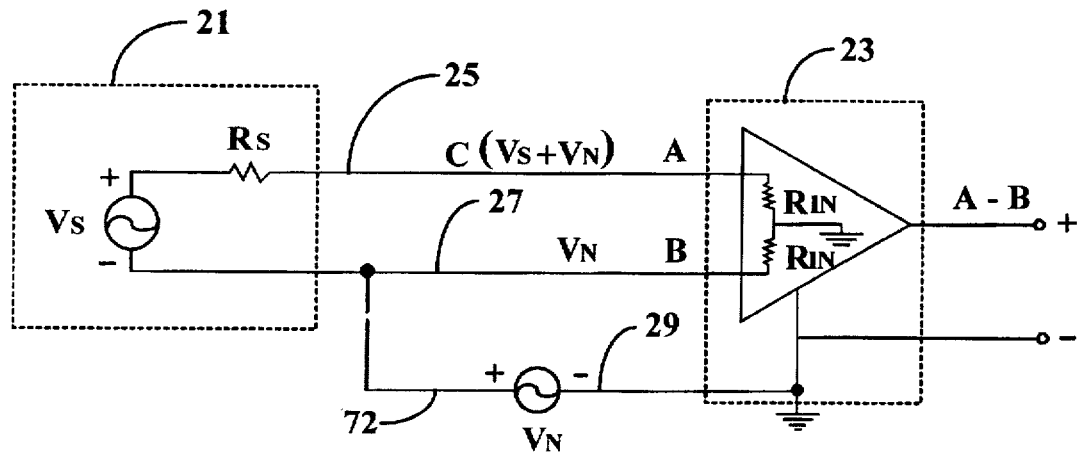
FIG. 3A illustrates the problem case of an unbalanced source connected to a balanced input amplifier.
Figure 3B:
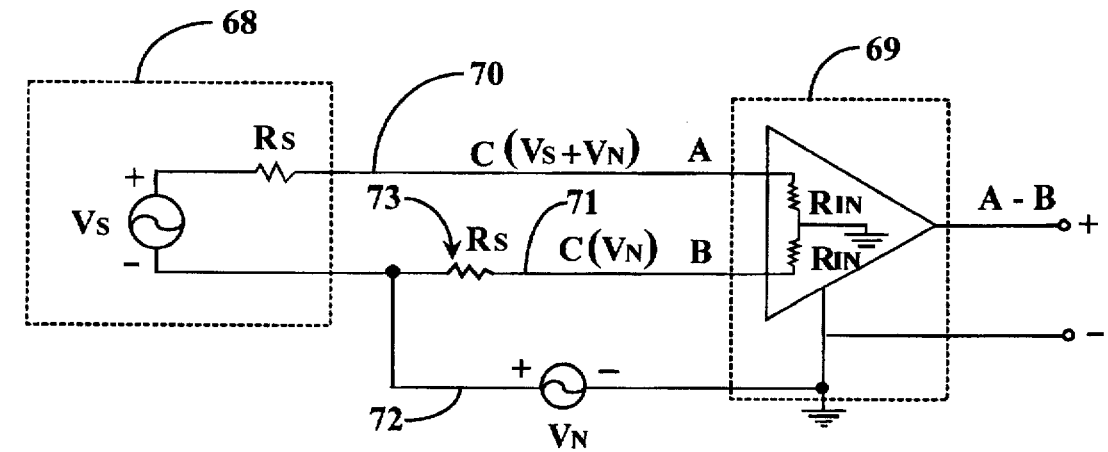
FIG. 3B is a schematic of an unbalanced source, as in FIG. 3A, but with a balancing resistor added, according to the present invention, to provide a balanced source.

FIG. 3B is a schematic of an unbalanced source, as in FIG. 3A, but with a balancing resistor added, according to the present invention, to provide a balanced source. Source 68 in FIG. 3B is an unbalanced source like source 21 in FIG. 3A. Balanced input amp 69 is connected to source 68 by an interconnecting cable, comprising hot conductor 70, cold conductor 71, and shield conductor 72, which has been modified to include resistor 73. This added resistor, when selected to provide an impedance equal to the unbalanced source impedance $R_S$, causes any signal on the cold line to be attenuated by the same factor C as the signal on the hot line. In this case the input amp takes the difference and obtains $C(V_S+V_N)-C(V_N)=C(V_S)$. We see that the $V_N$ component has been canceled, just as in the balanced case of FIG. 2. FIG. 3B illustrates the general case for the present invention, that is, that unbalanced sources can become balanced sources if a selectable or adjustable resistance element can be placed in line with the cold conductor to balance the source impedance, indicated by $R_S$, which is usually unknown for an unbalanced source.

Applying instruments to measure the impedance of an unbalanced source, and altering the source by internal alteration is not a practical way to deal with such a situation. Also, since the impedance is most often unknown, there is no way to select a resistor element which will precisely balance the source impedance. Further, there is no convenient place to add a resistor anyway to an unbalanced source without some rewiring.

Figure 4:
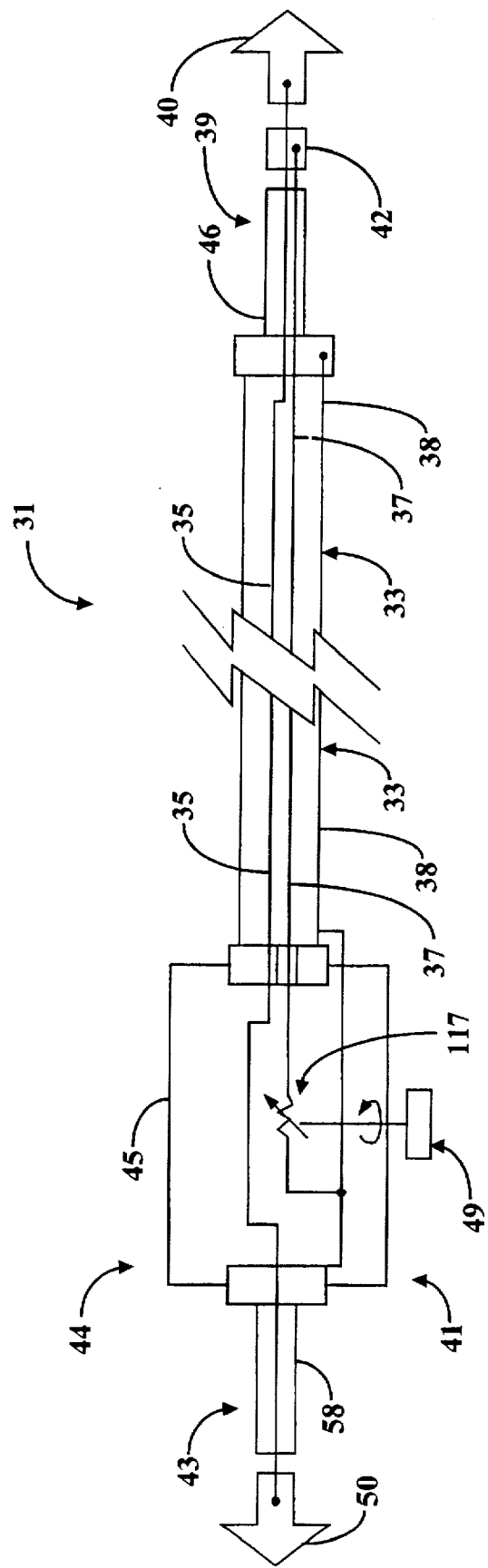
FIG. 4 is a mostly schematic cutaway illustration of a connector cable having an adjustable balancing resistor according to the present invention.

FIG. 4 is a mostly schematic cutaway illustration of a connector cable 31 in an embodiment of the present invention that solves the problem of unbalanced sources to be input to balanced input amplifiers in one common situation. Connector cable 31 in the embodiment of FIG. 4 has a cable portion 33 comprising a 2-conductor (hot 35 and cold 37) cable with a ground shield conductor 38. One end of connector cable 31 is a stereo-type, three-conductor, one-quarter inch plug 39, as is known in the art. Note that plug 39 has a hot portion 40 connected to hot conductor 35, and a floating cold portion 42 connected to cold conductor 37, as well as a ground portion 46 separate from cold portion 42. Ground portion 46 is connected to ground shield 38.

The opposite end of connector cable 31 has, in this embodiment, a unique balancing plug 44, comprising a standard mono-type, two-conductor, one-quarter inch plug 43, with an enclosure 45. The mono-type plug has a hot portion 50, and a ground portion 58. Hot portion 50 connects directly to hot conductor 35, which in turn, as described above, connects to hot portion 40 of plug 39 at the opposite end of the cable. Ground portion 58 connects to shield conductor 38, which connects in turn to ground portion 46 of plug 39 at the opposite end of cable 31.

Enclosure 45 contains a rotary potentiometer 47 adjustable via a knob 49 external to the enclosure. Ground portion 58 of plug 43 connects through rotary potentiometer 47 to Cold line 37, which connects in turn to cold portion 42 of plug 39 at the opposite end of the cable.

Cable 31 is used in practicing the present invention to connect an unbalanced source having a standard one-quarter inch two-conductor plug receptacle to a stereo-type, three-conductor plug receptacle of a balanced input amplifier of a mixer console or other audio processing instrument. When one makes the connection between the source and the audio instrument using the unique cable of FIG. 4, one simply monitors for "hum", and turns knob 49 to a position where the hum disappears. The value (magnitude) of the resistance placed in series in the cold line (37) of the cable at the point that hum disappears, even though the value is still not known, is such as to balance the source impedance (see $R_S$ in FIG. 2), so the balanced input amplifier cancels the common mode signal.

In variations of the preferred embodiment shown in FIG. 4, enclosure 45 may take many convenient forms, and knob 49 may be replaced by other operating interfaces, such as by a slotted screw head flush with a surface of enclosure 45. In other variations slide potentiometers may be used. In some variations a single-turn pot will be adequate. In others, a multiple-turn pot, such as a ten-turn pot, may be used to provide increased resolution. Of course, the length of cable 31 may be different in different models, and there are a variety of materials that may be used for the enclosure, the cable, and other elements.

Not all musical instruments and other sources or audio instruments such as mixer consoles use receptacles and connectors for which cable 31 of FIG. 4 would be suitable. Some sources and audio instruments use a three-pin connector known in the art as an XLR connector. There are situations encountered as well wherein an unbalanced source may have a two-conductor plug receptacle and the audio instrument to which one wishes to connect the source may have an XLR connector.

For use in the situation described immediately above, having mixed connectors, FIG. 5 illustrates an alternative embodiment of the present invention, which makes a transition from a standard two-conductor receptacle to a three-pin XLR male connector.

In FIG. 5, balancing adapter 51 has a standard two-conductor mono plug 53 at one end, and a male XLR connector 55 at the other. Ground portion 54 of the plug connects to pin (1) of the XLR connector directly, and to pin (3) through variable resistor element 52, which may be adjusted by a rotary manual input 56; for example a knob or screw head. Hot portion 62 of plug 53 connects directly to pin (2).

In the embodiment shown by FIG. 5, one may insert plug portion 53 of balancing adapter 51 into a two-conductor plug receptacle at the output of an unbalanced source, such as a musical instrument, and then use a standard XLR cable between XLR connector 55 of balancing adapter 51 and an XLR receptacle at a balanced input amplifier of an audio instrument, such as an audio mixer panel.

In another embodiment, there can be a three-wire cable from the plug portion to the XLR connector portion of the adapter of FIG. 5. The XLR connector can be either male or female.

The embodiments of the invention described above, providing individual balancing adapters for individual audio sources to be connected to an audio instrument, may be a cumbersome approach in a situation wherein there may be several unbalanced sources to be connected to an instrument, and the source impedance of each of the unbalanced sources will need to be balanced. In this situation, it would be desirable to have a single structure, similar to a patch panel, for connecting each of several unbalanced sources to an audio instrument.

FIG. 6A illustrates yet another embodiment of the invention, wherein an adapter box 60 is provided having multiple two-conductor plugs receptacles (Row 59) on one side 63, each plug associated with an adjustable resistor element, such as a potentiometer, and each adjustable resistor having a nearby physical input knob (Row 61). For example, receptacle 75 is associated with knob 77, which in turn, in this embodiment, operates a potentiometer within the adapter box. The potentiometer in the adapter box, operated by the knob, is wired in series in the cold line connected to the receptacle associated with the knob. In each case, the potentiometer is wired to provide impedance on the cold line for the associated plug receptacle.

FIG. 6B shows the opposite side 65 of adapter box 60, with a row 67 of XLR male connectors, such as connectors 69 and 79, interfaced to the box. The internal wiring for the box of FIG. 6A and 6B is essentially the same for each input receptacle, associated potentiometer and adjustment knob, and output XLR connector. In FIGS. 6A and 6B, male XLR connector 79 is wired with plug receptacle 75 and the potentiometer operated by knob 77, as is described in more detail below.

FIG. 7 is a partial section view through patch box 60 of FIGS. 6A and 6B along section line 7—7 of FIGS. 6A and 6B, passing through knob 77, plug receptacle 75 and male XLR connector 79, in the direction of the arrows. In this view, some elements are shown in section, but the wiring is largely schematic, to provide a clear description of how the elements of the patch are connected, and how they function.

Receptacle 75 has a cold portion 81, a hot portion 85, and an insulator portion 83 electrically separating the hot and cold portions. The receptacle is configured, as is known in the art, to receive a two-conductor plug, as known in the art. Cold portion 81 is connected within the box to pin (1) of XLR connector 79 by conductor 82. Hot portion 85 of the receptacle is connected by conductor 84 within the box to pin (2) of the XLR connector. Cold portion 81 is also connected within the box by a conductor 86 to an input of a rotary potentiometer 87, and the output of the rotary potentiometer is connected by a conductor 88 to pin 3 of the XLR connector.

A variable resistance symbol is shown within rotary potentiometer 87 to indicate that rotating knob 77 varies resistance between conductor 86 and conductor 88. With an unbalanced audio source connected by a cable having two-conductor plugs to receptacle 75, and the XLR connector connected to an input XLR connector at an audio instrument, such as an audio mixer panel, the source impedance may be balanced by rotating knob 77, varying resistance in rotary potentiometer 87. It will be apparent to those with skill in the art that the wiring of the elements in FIG. 7 is essentially the same as the wiring of corresponding elements in FIG. 5.

In a situation wherein several unbalanced sources need to be connected to several balanced input amplifiers of an audio mixer panel or other audio processing instrument, the sources are connected to plug receptacles of an adapter box like box 60, and XLR connectors at input amplifiers of the audio mixer panel or other audio processing instrument are connected by conventional XLR cables to the adapter box.

Each unbalanced source may then be balanced by adjusting the resistor element associated with each source at the adapter box.

It will be apparent to those with skill in the art that there are many variations of adapter box 60 which may be provided in different embodiments within the scope of the present invention. There may be more or fewer sets of inputs and outputs with adjustable resistances associated with each, for example. The nature of the connectors and receptacles may be varied as well, and the variable resistors can take several forms, as can the adjusting apparatus. The resistors could be linear resistors, for example, and the adjusting elements slide levers. The placement of the elements on the surfaces of such adapter boxes may be varied as well. The embodiment described is exemplary.

It will be apparent to those with skill in the art as well, that there are many variations in each of the embodiments described above, all of which fall within the sphere of the present invention. Connectors may be male or female, and of a variety of different sorts without departing from the scope of the invention. Connectors in some embodiments are of the RCA™ phono-type, such as commonly used with stereo and other high-fidelity sound equipment. Resistor elements for providing balancing impedance for unbalanced sources may take any one of several forms, and the range of resistance may be different in different embodiments. All of the embodiments described are exemplary, and many other embodiments within the scope of the invention will be suggested to those with skill in the art from the details and function of the embodiments described.

What is claimed is:

1. An impedance-balancing adapter for connecting an unbalanced source to a balanced input of an audio instrument, comprising:

a first connector having a first terminal and a second terminal, compatible with an output connector of an unbalanced audio source; and a second connector having a third terminal, a fourth terminal, and a fifth terminal, compatible with an input connector to a balanced input amplifier at an audio processing instrument, such as an audio mixer panel;

wherein the first terminal at the first connector is connected by a first electrical conductor to the third terminal at the second connector, the second terminal at the first connector is connected by a second electrical conductor to the fourth terminal at the second connector, and the second terminal at the first connector is connected by a third electrical conductor to the fifth terminal at the second connector through a variable resistor.

2. An impedance-balancing adapter as in claim 1 wherein the first connector is a two-conductor, one-quarter inch mono audio signal plug extending from a housing enclosing the variable resistor, the housing having a physical interface for adjusting the variable resistor, the second connector is a three-conductor, one-quarter inch stereo audio signal plug, and the first, second, and third electrical conductors form a shielded cable.

3. An impedance balancing adapter as in claim 2 wherein the variable resistor is a rotary potentiometer having a shaft input connected to a knob outside the housing.

4. An impedance balancing adapter as in claim 1 wherein the first connector is a two-conductor, one-quarter inch mono audio signal plug extending from a housing enclosing the variable resistor, the housing having a physical interface for adjusting the variable resistor, and the second connector is an XLR connector mounted through a wall of the housing.

5. An input balancing adapter as in claim 4 wherein the first second, and third electrical conductors form a shielded cable of any length separating the housing and one-quarter inch mono audio signal plug at one end from the XLR connector at an opposite end of the shielded cable.

6. An impedance balancing adapter as in claim 4 wherein the variable resistor is a rotary potentiometer having a shaft input connected to a physical interface, such as a knob, outside the housing, for adjusting the resistance magnitude of the rotary potentiometer.

7. An input balancing adapter box comprising:

an audio signal input connector having a first terminal and a second terminal, mounted through a wall of the box;

an audio signal output connector having a third, a fourth, and a fifth terminal, the output connector mounted through a wall of the box; and a variable resistor mounted within the box and having a physical input through a wall of the box with an interface outside the box for adjusting the resistance magnitude of the variable resistor;

wherein, within the box, and between the input and the output connectors, the first and third terminals are wired together, the second and fourth terminals are wired together, and the second terminal is coupled electrically to the fifth terminal through the variable resistor.

8. An input adapter balancing box as in claim 7 wherein the two-conductor connector is a one-quarter inch mono audio signal plug receptacle, and the three-conductor connector is a male XLR connector.

9. An input balancing adapter box as in claim 7 wherein the audio signal input connector, the audio signal output connector, and the variable resistor, wired together as in claim 7, form a first set, and the adapter box comprises plural sets of such connectors and variable resistors with physical inputs through a wall of the box, whereby plural unbalanced sources may be connected to the adapter box at individual ones of the plural input connectors, and through the box to audio instrument inputs connected at individual ones of the plural output connectors.

10. An audio input balancing adapter box as in claim 9 wherein the audio signal input connectors are selected from the group of a one-quarter inch mono audio signal receptacle, a multi-pin electronics connector, and a phono-type jack or receptacle, and the audio signal output connectors are selected from the group of a multi-pin electrical connector, and a phono-type jack or receptacle.

11. A method for balancing the impedance of an audio source connected to an audio processing instrument, comprising steps of:

(a) connecting a first connector having a first terminal and a second terminal to outputs of an unbalanced audio source;

(b) connecting a second connector having a third terminal, a fourth terminal, and a fifth terminal, to corresponding inputs of a balanced input amplifier of an audio processing instrument, such as an audio mixer panel;

(c) wiring the first terminal at the first connector to the third terminal at the second connector, the second terminal at the first connector to the fourth terminal at the second connector, and the second terminal at the first connector through a variable resistor to the fifth terminal at the second connector; and (d) adjusting the variable resistor to match the source impedance.

* * * * *